US012562219B2

(12) United States Patent (10) Patent No.: US 12,562,219 B2

Haywood (45) Date of Patent: Feb. 24, 2026

(54) INTEGRATED CIRCUIT MEMORY DEVICES WITH UNIDIRECTIONAL PORTS FOR CONCURRENT INTERFACE OPERATIONS

(71) Applicant: Rambus, Inc., San Jose, CA (US)

(72) Inventor: Christopher Haywood, Fernandina Beach, FL (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 18/555,714

(22) PCT Filed: Apr. 14, 2022

(86) PCT No.: PCT/US2022/024847

§ 371 (c)(1),
(2) Date: Oct. 16, 2023

(87) PCT Pub. No.: WO2022/225788

PCT Pub. Date: Oct. 27, 2022

(65) Prior Publication Data

US 2024/0212743 A1 Jun. 27, 2024

Related U.S. Application Data

(60) Provisional application No. 63/177,807, filed on Apr. 21, 2021.

(51) Int. Cl.
*G11C 11/4093* (2006.01)
*G11C 11/4076* (2006.01)
(Continued)

(52) U.S. Cl.
CPC ...... *G11C 11/4093* (2013.01); *G11C 11/4076* (2013.01); *G11C 11/4096* (2013.01); *G11C 29/42* (2013.01)

(58) Field of Classification Search
CPC ........... G11C 11/4093; G11C 11/4076; G11C 11/4096; G11C 29/42
See application file for complete search history.

(56) References Cited

U.S. PATENT DOCUMENTS 4,451,880 A * 5/1984 Johnson .............. G06F 13/1642
711/157
5,778,419 A 7/1998 Hansen et al.
(Continued)

OTHER PUBLICATIONS

Gjessing et al., "A RAM Link for High Speed", IEEE, 1992, pp. 52-53. 2 Pages.
(Continued)

*Primary Examiner* — Robert W Beausoliel, Jr.
(74) *Attorney, Agent, or Firm* — Lowenstein Sandler LLP

(57) ABSTRACT

Technologies for concurrent interface operations of integrated circuit memory devices are described. An integrated circuit memory device includes an input port, a control port, and an output port. The input port receives interleaved input and a first timing reference. The interleaved input includes one or more commands or write data. The control port receives one or more control signals that specify that the interleaved input is the one or more commands or the write data. The output port transmits read data and a second timing reference. The commands or write data can be received concurrently with transmitting the read data.

20 Claims, 10 Drawing Sheets

(51) Int. Cl.
*G11C 11/4096* (2006.01)
*G11C 29/42* (2006.01)

(56) References Cited

U.S. PATENT DOCUMENTS

| | | | |
|---|---|---|---|
| 6,031,767 A | 2/2000 | Schuh et al. | |
| 6,598,198 B1 | 7/2003 | Furuta et al. | |
| 6,880,056 B2 | 4/2005 | Kootstra | |
| 7,110,400 B2 | 9/2006 | Hronik | |
| 7,209,405 B2 | 4/2007 | Jeddeloh | |
| 7,652,922 B2 | 1/2010 | Kim et al. | |
| 7,697,363 B2 | 4/2010 | Chung | |
| 8,397,020 B2 | 3/2013 | Kootstra | |
| 8,825,967 B2 | 9/2014 | Hong Beom | |
| 2009/0185434 A1 | 7/2009 | Pyeon | |
| 2011/0307672 A1 | 12/2011 | Ware | |
| 2013/0151757 A1* | 6/2013 | Hong Beom | G11C 7/1003 |
| | | | 711/E12.008 |
| 2015/0089164 A1* | 3/2015 | Ware | G11C 29/023 |
| | | | 711/149 |
| 2015/0127993 A1* | 5/2015 | Sankar | G06F 11/3466 |
| | | | 714/45 |
| 2017/0147241 A1 | 5/2017 | Flynn et al. | |
| 2019/0355407 A1 | 11/2019 | Lee et al. | |

OTHER PUBLICATIONS

Gjessing, Stein et al., "RamLink: A High-Bandwidth Point-to-Point Memory Architecture", IEEE, 1992, pp. 328-331, 4 pages.

Microchip Technology Inc., "25CSM04 Data Sheet—4-Mbit SPI Serial EEPROM with 128-Bit Serial Number and Enhanced Write Protection", DS20005817C, 2019-2020. Downloaded at: http://ww1.microchip.com/downloads/en/DeviceDoc/25CSM04-4-Mbit-SPI-Serial-EEPROM-With-128-Bit-Serial-Number-and-Enhanced-Write-Protection-20005817C.pdf. 52 pages.

Notification of Transmittal of the International Search Report and the Written Opinion of the International Searching Authority, or the Declaration with Mail Date Aug. 16, 2022 re: Int'l Appln. No. PCT/US2022/024847. 8 pages.

EP Extended European Search Report with Mail Date Feb. 14, 2025 re: EP Appln. No. 22792235.8. 11 pages.

\* cited by examiner

300

| DQ-DDR pins | DQ-DDR pin description |
|---|---|
|  |  |
| Q0 | Read data (output) |
| Q1 | Read data (output) |
| Q2 | Read data (output) |
| Q3 | Read data (output) |
| RDQS0_t | Strobe for read data |
| RDQS0_c | Strobe for read data |
| Q4 | Read data (output) |
| Q5 | Read data (output) |
| Q6 | Read data (output) |
| Q7 | Read data (output) |
| RDQS1_t | Strobe for read data |
| RDQS1_c | Strobe for read data |
| QCS | Enable output for read data |
|  |  |
| D0 | Command/write data |
| D1 | Command/write data |
| D2 | Command/write data |
| D3 | Command/write data |
| WCK0_t | Strobe for command/write data |
| WCK0_c | Strobe for command/write data |
| D4 | Command/write data |
| D5 | Command/write data |
| D6 | Command/write data |
| D7 | Command/write data |
| WCK1_t | Strobe for command/write data |
| WCK1_c | Strobe for command/write data |
| DCS | Enable input for write data |
| CCS | Enable input for commands |

INTEGRATED CIRCUIT MEMORY DEVICES WITH UNIDIRECTIONAL PORTS FOR CONCURRENT INTERFACE OPERATIONS

BACKGROUND

Modern computer systems generally include a data storage device, such as a memory component or device. The memory component may be, for example, a random access memory (RAM) or a dynamic random access memory (DRAM). The memory device includes memory banks made up of memory cells that a memory controller or memory client accesses through a command interface and a data interface within the memory device.

BRIEF DESCRIPTION OF THE DRAWINGS

The present disclosure is illustrated by way of example, and not by way of limitation, in the figures of the accompanying drawings.

FIG. 3 illustrates a pinout of an integrated circuit memory device with unidirectional ports, according to at least one embodiment.

DETAILED DESCRIPTION

Figure 1:
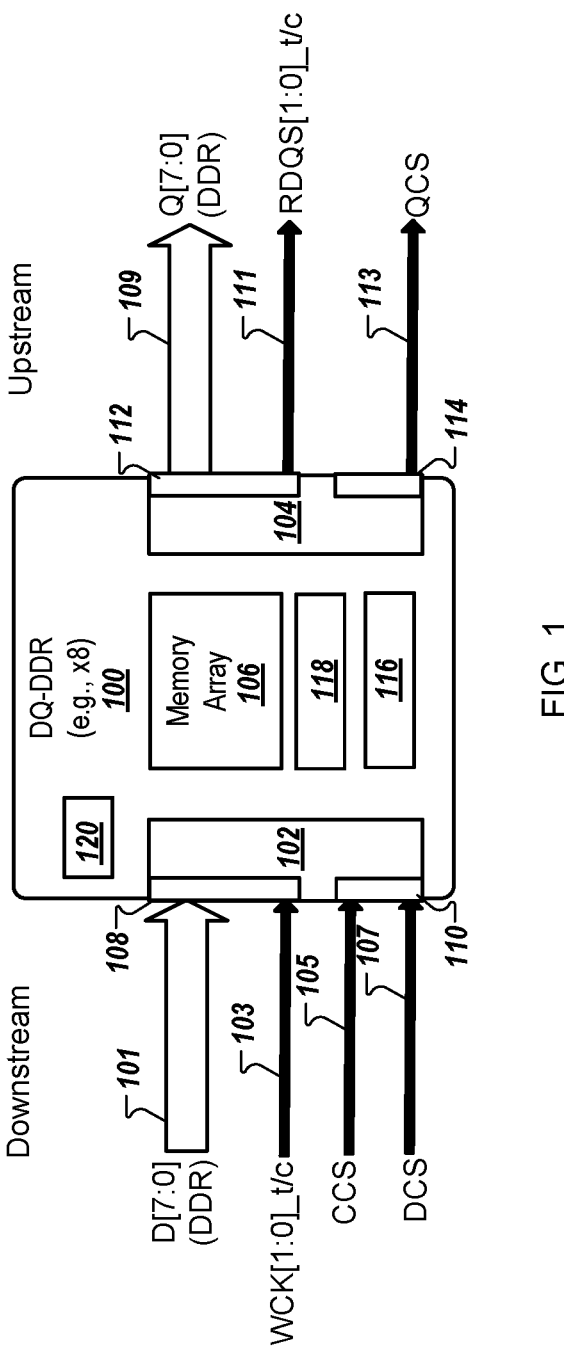
FIG. 1 is a block diagram of an integrated circuit memory device with unidirectional ports for concurrent interface operations, according to at least one embodiment.

The following description sets forth numerous specific details, such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

The present disclosure is directed to embodiments of integrated circuit memory devices with unidirectional ports for concurrent interface operations. The present disclosure is also directed to embodiments of integrated circuit controller devices with unidirectional ports for concurrent interface operations. Aspects of the present disclosure can separate interface operations into downstream and upstream operations, providing alternate attach points for memory. For example, the downstream operations can include receiving interleaved or multiplexed input, including commands and write data, and the upstream operations can include sending read data, write acknowledgments, status data, errors, or the like. Aspects of the present disclosure can improve the average latency, simplify the translation from serial protocols to native memory protocols, reduce the complexity of buffering and scheduling logic, and allow the transition to optical interconnects. Aspects of the present disclosure can separate input and output pins (or other types of terminals) to allow concurrent interface operations and more closely match a host-side serial downstream/upstream bandwidth. The read and write transfers can occur at the same time on the separated input and output pins. There are no turnaround delays since the read and write transfers can occur at the same time, simultaneously, or concurrently. Since there are no turnaround delays, the overall latency is reduced. Aspects of the present disclosure can increase pin frequencies, pin margins, or both since the ports are unidirectional. For example, there are no drivers at the input port (e.g., receiver pads) because the input port is unidirectional. As such, the input port can have lower capacitances than bi-directional ports that have both receivers and drivers sharing the same pins.

In at least one embodiment, an integrated circuit memory device includes an input port, a control port, and an output port. The input port receives interleaved input and a first timing reference. The interleaved input includes commands or write data. The control port receives one or more control signals that specify that the interleaved input is the one or more commands or the write data. The output port transmits read data and a second timing reference. Additional details of the integrated circuit memory devices are described below with respect to the embodiments of FIG. 1.

FIG. 1 is a block diagram of an integrated circuit memory device 100 with unidirectional ports for concurrent interface operations, according to at least one embodiment. The integrated circuit memory device 100 (hereinafter "memory device 100") includes a downstream serial interface 102, an upstream serial interface 104, and a memory array 106. The downstream serial interface 102 includes an input port 108 and a control port 110. The upstream serial interface 104 includes an output port 112 and a control port 114. In at least one embodiment, the input port 108, the control port 110, and the output port 112 are unidirectional ports.

In at least one embodiment, the input port 108 receives interleaved input 101 and a first timing reference 103. The first timing reference 103 can be differential clock strobes (e.g., WCK[1:0]_t/c). The first timing reference 103 can be a single-ended clock signal or strobe. The interleaved input 101 can include commands (e.g., read commands, write commands) and write data. The control port 110 receives one or more control signals that specify that the interleaved input is the one or more commands or the write data. As illustrated in FIG. 1, the control port 110 receives a first command signal 105 (CCS) that specifies that the interleaved input 101 is a command or a second signal 107 (DCS)

that specifies that the interleaved input 101 is write data. The first command signal 105 can be a chip select type signal, a strobe signal, an enable signal, a command enable signal, or the like. In at least one embodiment, the first command signal 105 and the second command signal 107 can be communicated as different levels of the same signal. Using two command signals allows four states to be used, including a command state, a data state, a status state (e.g., both the first command signal 105 and the second command signal 107 being asserted together), and a reserved state, for example.

In at least one embodiment, the output port 112 transmits output data 109 and a second timing reference 111. The output data 109 can be read data, status data, error data, write acknowledgments, or the like. The second timing reference 111 can be a clock signal, such as differential clock strobes (e.g., RDQS[1:0]_t/c). The second timing reference 111 can be a differential clock signal or a single-ended clock signal or strobe. In at least one embodiment, the input port 108 receives write data, and output port 112 transmits read data concurrently. In at least one embodiment, the input port 108 receives command data, and the output port 112 transmits read data concurrently. The control port 114 transmits one or more control signals that specify that the output port 112 is enabled or ready with the read data. As illustrated in FIG. 1, the control port 114 transmits an output enable signal 113 (QCS) that specifies that the output port 112 is enabled for the read data. The output enable signal 113 can be a chip select type signal, a strobe signal, an enable signal, a command enable signal, or the like.

In at least one embodiment, the input port 108 and the output port 112 allow for concurrent interface operations, such as write data and read data being transferred concurrently or at the same time. The input port 108 and the output port 112 allow a closer match to the host-side serial downstream and serial upstream bandwidths. Using the separate input port 108 and the output port 112, there are no turn-around delays because the read and write transfers can co-occur. This can reduce the overall latency of the memory device 100.

In at least one embodiment, the interleaved input 101 includes input packets that are either command packets or write data packets. Alternatively, the input packet can include a command or data and error correction code (ECC) data. The interleaved input 101 can include the following packet examples, <CMD:DATA> or <CMD:DATA:ECC>. That is, the input packet can include a command or data. In at least one embodiment, the output data 109 includes output packets. The output packet can include read data, status data, data and ECC data, or status data and ECC data. The output data 109 can include the following packet examples, <DATA>; <STATUS>, <DATA:ECC> or <STATUS:ECC>. It should be noted that the ECC data can be implemented in different manners. For example, the ECC data can be sent immediately following the relevant packet, as a set of bits in a dedicated lane or lanes, or as a set of dedicated bits in a fixed regular repeating pattern to protect the previous block independent of packet boundaries.

In at least one embodiment, the output port 112 is coupled to or includes driver circuitry. The driver circuitry is used to drive signals on the output port 112. In at least one embodiment, the driver circuitry transmits the read data or other output data 109. In at least one embodiment, the driver circuitry transmits the output data 109 and the second timing reference 111. In contrast, a bi-directional port includes both a driver and a receiver. A bi-directional port can have signal interference between the driver and receiver. In at least one embodiment, the input port 108 is a unidirectional port coupled to receiver circuitry and does not include driver circuitry. This can reduce the capacitance on the input port 108. Reducing the capacitance on the input port 108 can increase receivers' margins and allow them to operate at a higher frequency. In at least one embodiment, the receivers of the input port 108 can operate at different frequencies than transmitters of the output port 112. For example, in one embodiment, the receivers can operate at a higher frequency than the transmitters. In other embodiments, the receivers and the transmitters can operate at the same frequency. In at least one embodiment, the memory device 100 is compatible with a Joint Electron Device Engineering Council (JEDEC) memory standard. For example, the memory device 100 can have an identical pinout as a double data rate (DDR) DRAM memory device. The memory device can optionally operate with bi-modality. The bi-modality can be configurable. The pins, however, can be assigned to the respective unidirectional ports, such as described in more detail below with respect to FIG. 3.

In at least one embodiment, the input port 108, the output port 112, the control port 110, and control port 114 are coupled to a serial data buffer (SDB) device that is coupled to a downstream serial link and an upstream serial link. The SDB device can be coupled to multiple downstream serial links and multiple upstream serial links to support multiple memory devices. In at least one embodiment, the SDB device includes a downstream serial interface and an upstream serial interface to communicate with a host (also referred to as a host-computing device). The downstream serial interface includes a receiver, and the upstream serial interface includes a transmitter. The downstream serial interface can include a differential pair of receivers, and the upstream serial interface can include a differential pair of transmitters. For example, an SDB coupled to two memory devices can have two differential pairs of transmitters and two differential pairs of receivers. In at least one embodiment, the downstream serial link includes a differential pair of receiver lines, and the upstream serial link includes a differential pair of transmitter lines. In at least one embodiment, the downstream serial link can include an optical-to-electrical (O2E) converter that converts an optical signal to an electrical signal. The upstream serial link can include an electrical-to-optical (E2O) converter that converts an electrical signal to an optical signal. In another embodiment, the SDB device can be an optical SDB device with an optical interface coupled to optical links with the host and an electrical interface coupled to the memory device 100. Additional details of the SDB devices are described below with respect to FIGS. 4-8.

During the operation of the memory device 100, the interleaved input 101 can include a first input packet with a first command and a second input packet with first write data. The first timing reference 103 includes a write clock signal (WCK) for the writing data's timing. The write clock signal can be one or two input strobes (e.g., two input strobes when the clock signal is a differential clock signal). The memory device 100 receives the first command signal 105 when the interleaved input 101 is the first command and receives the second command signal 107 when the interleaved input is the first write data. The first command signal 105 and the second command signal 107 specify whether the incoming packet is a command or write data. In at least one embodiment, the memory device 100 includes a command decoder 116 and a write buffer 118 (e.g., write first-in-first-out (FIFO) buffer). The command decoder 116 is loaded with the first command responsive to the first command signal 105. The write buffer 118 is loaded with the first write data responsive to the second command signal 107.

During the operation of the memory device 100, the output data 109 can include a first output packet with first read data. The second timing reference 111 can include a read clock signal. The read clock signal can be one or two read clock strobes (e.g., RDQS[1:0]_t/c when the read clock signal is a differential clock signal). The output data 109 can also include a second output packet with first status data, write acknowledgment, errors, or the like. The memory device 100 transmits the output enable signal 113. The output enable signal 113 can specify that the first read data is enabled on the output port 112. Alternatively, the memory device 100 transmits the output enable signal 113 to specify that status data, error data, or the like is ready or enabled on the output port 112.

In at least one embodiment, the memory device 100 includes a register 120 to store a write latency (WL) value. The WL value specifies an amount of time between when a write command is received at the input port 108 and the corresponding write data is transferred to the memory array 106. The WL value can be programmable. In another embodiment, the memory device 100 can have a WL parameter that specifies the amount of time it takes the write data to be ready to transfer to the memory array 106, and the WL value can be an offset value that is added or subtracted from the WL parameter to specify when the write data is transferred from the write buffer 118 to the memory array 106.

In at least one embodiment, the WL value can be used to transfer whatever data is loaded into the write buffer 118 to the memory array 106. In another embodiment, write data must be pre-loaded into the write buffer 118 before the specified WL value expires. In another embodiment, the "posted" data is committed to the memory array 106 at a write command immediately-whatever is in the write buffer 118 is loaded into the memory array 106 at a write command. The DRAM write command is not needed until it needs to send new write data. It should be noted that read operations to the exact same location should be prevented in this scenario. In another embodiment, any intermediate WL value can be pre-loaded into the memory device 100.

In at least one embodiment, the interleaved input 101 includes a third input packet with a first read command. The third input packet can be received between the first input packet and the second input packet, as illustrated in FIGS. 2A-2B.

Figure 2A:
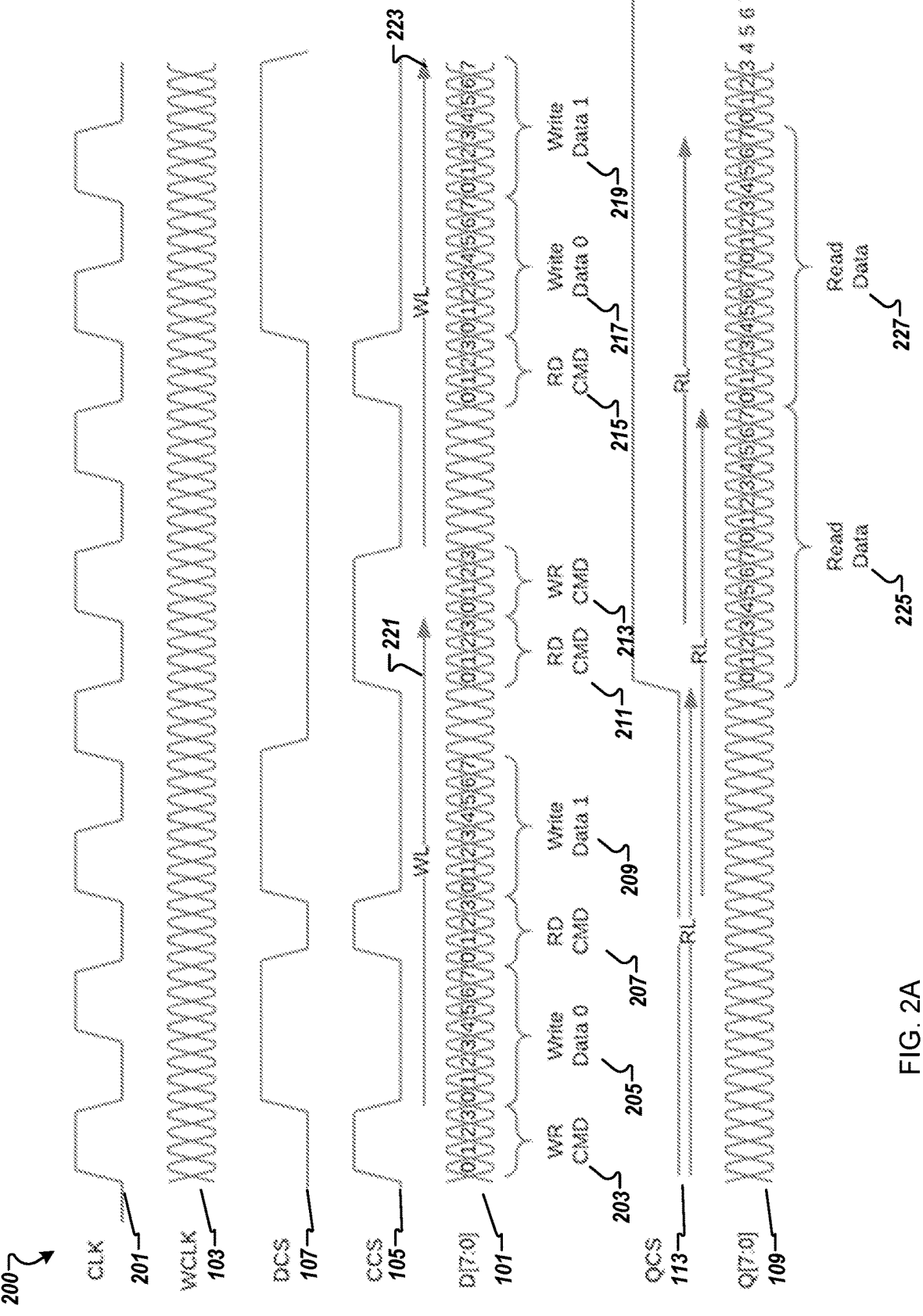
FIG. 2A is a timing diagram illustrating interleaved input with commands and write data on an input port, according to at least one embodiment.
Figure 2B:
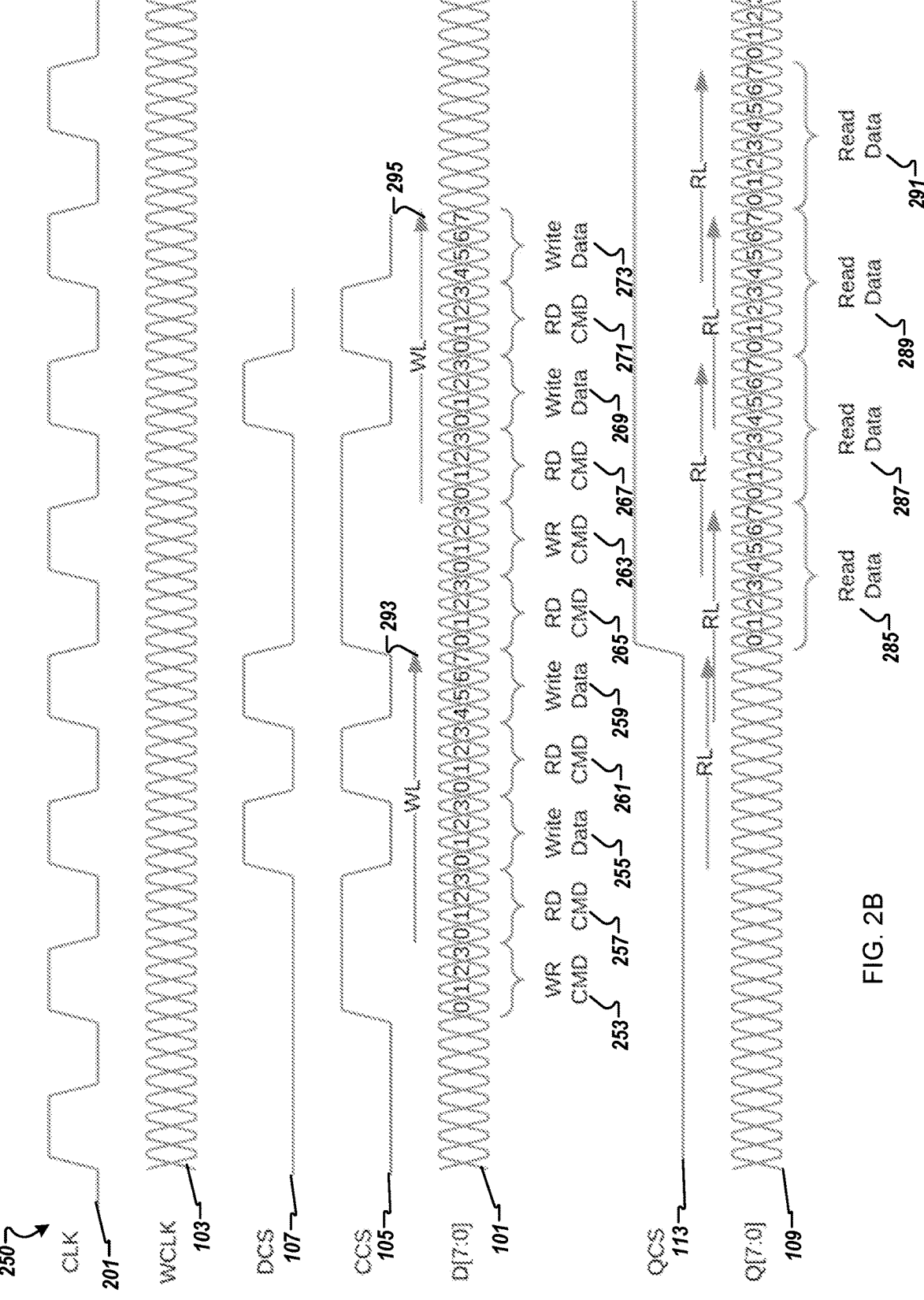
FIG. 2B is a timing diagram illustrating interleaved input with commands and write data on an input port, according to at least one embodiment.

FIG. 2A is a timing diagram 200 illustrating interleaved input 101 with commands and write data on an input port, according to at least one embodiment. The timing diagram 200 illustrates signals received by and sent from the memory device 100 of FIG. 1. The timing diagram 200 includes a clock signal 201. The clock signal 201 can be used for operations performed on the memory device 100 of FIG. 1. The timing diagram 200 includes the first timing reference 103 (e.g., a write clock) used in connection with the interleaved input 101. The timing diagram 200 also includes the first command signal 105 (CCS) and the second command signal 107 (DCS). The interleaved input 101 includes a first write command 203, first write data 205, a first read command 207, second write data 209, a second read command 211, a second write command 213, a third read command 215, third write data 217, and fourth write data 219. The first write data 205 and the second write data 209 can correspond to the first write command 203, and the third write data 217 and the fourth write data 219 can correspond to the second write command 213.

As illustrated in FIG. 2A, when the first command signal 105 (CCS) is active in a first instance, the interleaved input 101 is the first write command 203. In the next instance, the first command signal 105 is active, and the interleaved input 101 is the first read command 207. When the second command signal 107 (DCS) is active in the first instance, the interleaved input 101 is the first write data 205. In the next instance, the second command signal 107 is active, and the interleaved input 101 is the second write data 209. Similarly, as the first command signal 105 is active, commands are received on the input port. As the second command signal 107 is active, write data is received on the input port.

As illustrated in FIG. 2A, after the first write command 203 is received at the input port, a write latency (WL) counter can be started. For example, a first WL value 221 can specify an amount of time (e.g., a minimum amount of time) before the second write command 213 can be issued on the input port. Once the second write command 213 is issued, a second WL value 223 can specify an amount of time before another write command can be issued on the input port. As described herein, the WL value can be an amount of time between when a write command is received at the input port and the corresponding write data is transferred to the memory array. In at least one embodiment, the write data (e.g., first write data 205 and second write data 209) must be pre-loaded into the write before the first WL value 221 in the WL counter expires. In another embodiment, whatever write data is loaded in the write buffer is transferred at the write command. This can occur when new write data for a subsequent write command is sent. In another, the WL value can be an intermediate value that is specified in a register of the memory device 100. In at least one embodiment, the first command signal 105 loads the command decoder, and the second command signal 107 loads the write buffer. In at least one embodiment, whatever data is loaded into the write buffer at the WL value is transferred to the memory array.

As illustrated in FIG. 2A, after the first read command 207 is received on the input port, there is a read latency between when the read command is received and the data is available on the output port. The output enable signal 113 (QCS) is active when the output data 109 is ready on the output port. For example, first read data 225 is available on the output port when the output enable signal 113 is active. Since the output port is not shared with the write data, the output port can continue to make read data available, such as illustrated in FIG. 2A. The output enable signal 113 remains active and second read data 227 is available on the output port. In at least one embodiment, the second timing reference 111 (not illustrated in FIG. 2A) is similar to the first timing reference 103. In another embodiment, the first timing reference 103 and the second timing reference 111 are different frequencies as described herein.

FIG. 2B is a timing diagram 250 illustrating interleaved input with commands and write data on an input port, according to at least one embodiment. The timing diagram 200 is similar to the timing diagram 200, as noted by similar reference numbers. The timing diagram 200 is for burst lengths of 16, and the timing diagram 250 is for burst lengths of 8. As such, the interleaved input 101 and the read data (output data 109) are different in the timing diagram 250.

As illustrated in FIG. 2B, the interleaved input 101 includes a first write command 253, followed by first write data 255. The interleaved input 101 includes an intervening first read command 257 between the first write command 253 and the first write data 255. The interleaved input 101 further includes a second read command 261, second write data 269, a third read command 265, a second write command 263, a fourth read command 267, third write data 269, a fifth read command 271, and fourth write data 273.

As illustrated in FIG. 2B, when the first command signal 105 (CCS) is active in a first instance, the interleaved input 101 is the first write command 253 and the first read command 257. In the next instance, the first command signal 105 is active, and the interleaved input 101 is the second read command 261. In the next instance, the first command signal 105 is active, and the interleaved input 101 is the third read command 265, the second write command 263, and the fourth read command 257. When the second command signal 107 (DCS) is active in the first instance, the interleaved input 101 is the first write data 255. In the next instance, the second command signal 107 is active, and the interleaved input 101 is the second write data 259. In the next instance, the second command signal 107 is active, and the interleaved input 101 is the third write data 269. Similarly, as the first command signal 105 is active, commands are received on the input port. As the second command signal 107 is active, write data is received on the input port.

As illustrated in FIG. 2B, after the first write command 253 is received at the input port, a write latency (WL) counter can be started. For example, a first WL value 293 can specify an amount of time (e.g., a minimum amount of time) before the second write command 263 can be issued on the input port. Once the second write command 263 is issued, a second WL value 295 can specify an amount of time before another write command can be issued on the input port. As described herein, the WL value can be an amount of time between when a write command is received at the input port and the corresponding write data is transferred to the memory array. In at least one embodiment, the write data (e.g., first write data 255 and second write data 259) must be pre-loaded into the write buffer before the first WL value 293 in the WL counter expires. In another embodiment, whatever write data is loaded in the write buffer is transferred at the write command. This can occur when new write data for a subsequent write command is sent. In another, the WL value can be an intermediate value that is specified in a register of the memory device 100. In at least one embodiment, the first command signal 105 loads the command decoder, and the second command signal 107 loads the write buffer. In at least one embodiment, whatever data is loaded into the write buffer at the WL value is transferred to the memory array.

As illustrated in FIG. 2B, after the first read command 257 is received on the input port, there is a read latency between when the read command is received and when the data is available on the output port. The output enable signal 113 (QCS) is active when the output data 109 is ready on the output port. For example, first read data 285 is available on the output port when the output enable signal 113 is active. Since the output port is not shared with the write data, the output port can continue to make read data available, such as illustrated in FIG. 2B. The output enable signal 113 remains active and second read data 287, the third read data 289, and fourth read data 291 are available on the output port. In at least one embodiment, the second timing reference 111 (not illustrated in FIG. 2B) is similar to the first timing reference 103. In another embodiment, the first timing reference 103 and the second timing reference 111 are different frequencies as described herein.

FIG. 3 illustrates a pinout 300 of an integrated circuit memory device with unidirectional ports, according to at least one embodiment. The pinout 300 includes Q pins, D pins, and control and timing pins.

The Q pins 302-316 can be used to send read data. Control pins 318-320 can be used to send strobe signals for sending a portion of the read data (e.g., a first nibble) on Q pins 302-308, and control pins 322-324 can be used to send strobe signals for sending another portion of the read data (e.g., a second nibble) on Q pins 310-316. Control pin 326 (QCS) can be used to send an enable signal for the read data on Q pins 302-316. That is, the QCS signal can be sent as an output with the data signals on the Q pins 302-316.

The D pins 328-342 can be used to receive interleaved input, including commands (e.g., read or write command) or write data. Control pins 344-346 can be used to receive strobe signals for receiving a portion of the interleaved input (e.g., a first nibble) on Q pins 328-334, and control pins 348-350 can be used to receive strobe signals for receiving another portion of the interleaved input (e.g., a second nibble) on Q pins 336-342. Control pins 352-354 can be used to specify whether the interleaved data is a command or write data. In particular, control pin 352 can enable data input on the D pins 328-342, and control pin 354 can enable command input on the D pins 328-342.

In at least one embodiment, the pinout 300 has an equal number of pins as a pinout for a DDR memory device, such as DDR5. The pinout 300 can have similar pin assignments as the DDR5. For example, data bus (DQ) pins of DDR5 can be the Q pins 302-316, and some of the command and address (CA) pins can be the D pins 328-342, and others of the CA pins can be used for the control pins. Alternatively, other pinouts with unidirectional input and output ports can be used for the memory device.

Figure 4:
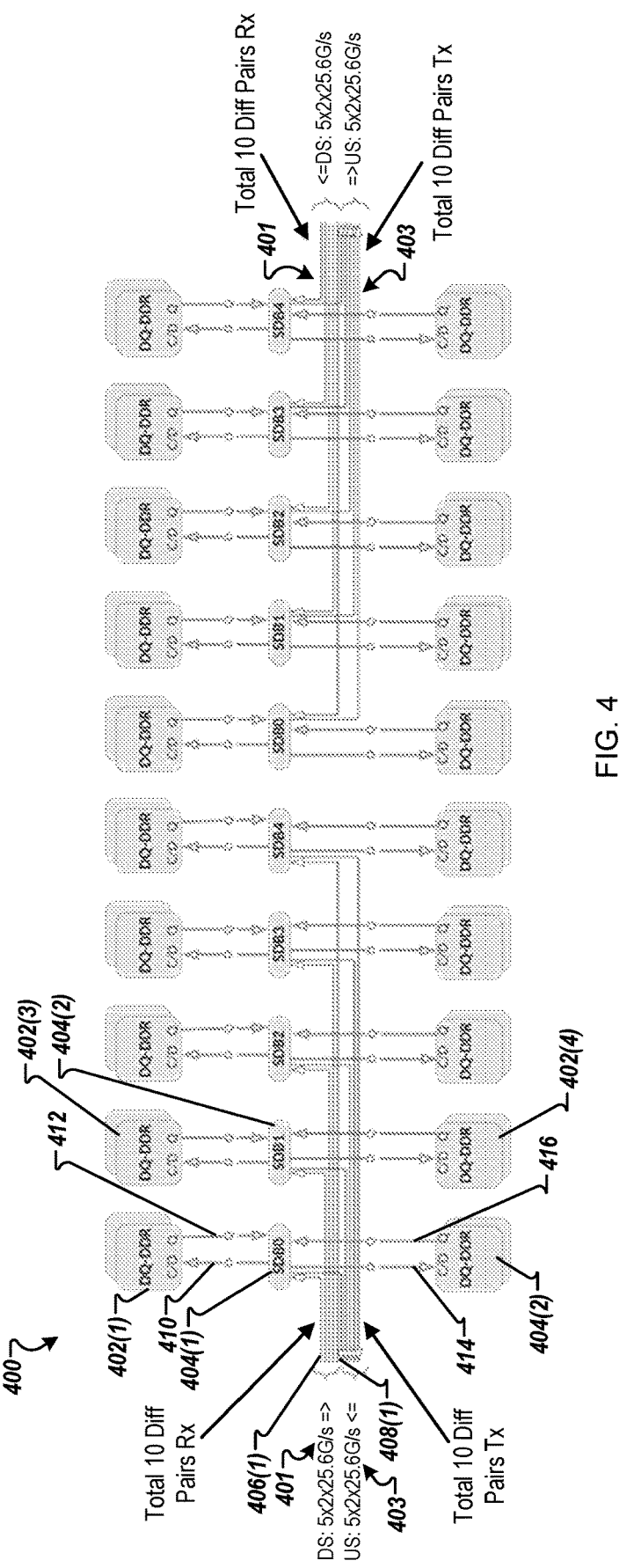
FIG. 4 is a block diagram illustrating a memory module with DRAM devices with unidirectional ports and serial data buffer (SDB) devices, according to at least one embodiment.

FIG. 4 is a block diagram illustrating a memory module 400 with DRAM devices 402 with unidirectional ports and serial data buffer (SDB) devices 404, according to at least one embodiment. The memory module 400 includes multiple DRAM devices 402 and multiple SDB devices 404. The memory module 400 can be coupled to one or more host computing devices (not illustrated in FIG. 4) via upstream and downstream serial links. In one embodiment, the memory module 400 includes a downstream serial interface 401 and an upstream serial interface 403, and multiple SDB devices 404 coupled to the downstream serial interface 401 and the upstream serial interface 403. Multiple DRAM devices 402 are coupled to the SDB devices 404.

As illustrated in FIG. 4, two DRAM devices 402 are coupled to an SDB device 404, and each SDB device is coupled to a memory controller of a host computing system. In particular, a first SDB device 404(1) is coupled to a downstream serial interface 406(1) and an upstream serial interface 408(1), and a first DRAM device 402(1) is coupled to the first SDB device 404(1). The first DRAM device 402(1) includes an input port that is coupled to input lines 410 (D lines) and an output port that is coupled to output lines 412 (Q lines). The input port of the first DRAM device 402(1) receives interleaved input that includes commands or write data on the input lines 410. The output port of the first DRAM device 402(1) transmits read data on the output lines 412. The first DRAM device 402(1) can include a control port that receives one or more timing reference signals and one or more control signals that specify that the interleaved input is the command or write data on the input lines 410. A second DRAM device 402(2) is also coupled to the first SDB device 404(1). The second DRAM device 402(2) includes an input port that is coupled to input lines 414 (D lines) and an output port that is coupled to output lines 416 (Q lines). The input port of the second DRAM device 402(2) receives interleaved input that includes commands or write data on the input lines 414. The output port of the second DRAM device 402(2) transmits read data on the output lines 416. The second DRAM device 402(2) can include a control port that receives one or more timing reference signals and one or more control signals that specify that the interleaved input is the command or write data on the input lines 414.

As illustrated in FIG. 4, the memory module 400 includes a second SDB device 404(2) coupled to the downstream serial interface 401 and the upstream serial interface 403. A third DRAM device 402(3) and a fourth DRAM device 402(4) are coupled to the second SDB device 404(2) and include similar ports as the first and second DRAM devices. Similarly, other DRAM devices are coupled as pairs to the other SDB devices. As illustrated in FIG. 4, the DRAM devices 402 and the SDB devices 404 are organized as a first set of ten DRAM devices coupled as pairs to a first set of five SDB devices and a second set of ten DRAM devices coupled as pairs to a second set of five SDB devices. Alternatively, other configurations of coupling the DRAM devices and SDB devices are possible.

Each of the SDB devices 404 includes a differential pair of receivers and a differential pair of transmitters. The downstream serial interface 401 can include ten differential pairs of receiver lines, and the upstream serial interface 403 can include ten differential pairs of transmitter lines. The first SDB device 404(1) can receive input serially on the differential pair of receivers and pass the serial input as parallel input to the first DRAM device 402(1) on the input lines 410. The first SDB device 404(1) can receive output data from the first DRAM device 402(1) on the output lines 412 and pass the output data as serial data on the differential pair of transmitters.

Figure 5:
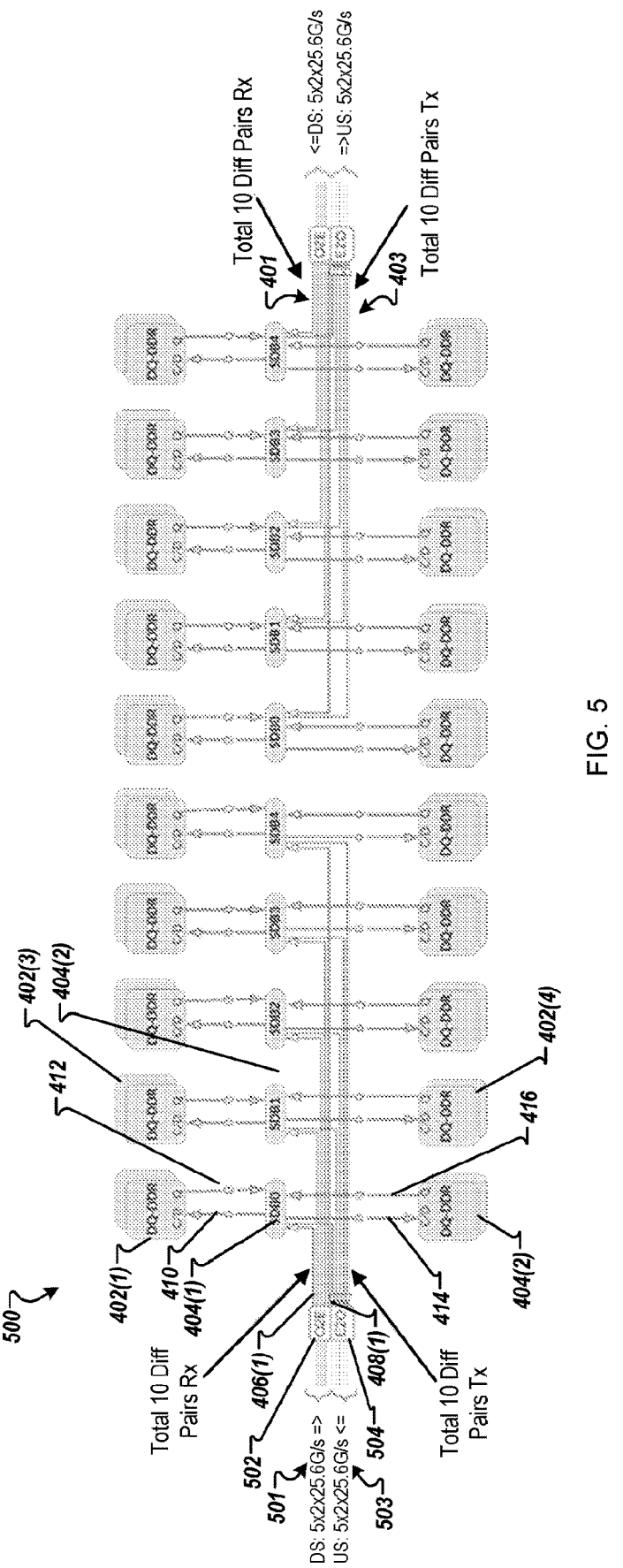
FIG. 5 is a block diagram illustrating a memory module with DRAM devices with unidirectional ports, SDB devices, and optical-to-electrical (O2E) converters, and E2O converters, according to at least one embodiment.

FIG. 5 is a block diagram illustrating a memory module 500 with DRAM devices 402 with unidirectional ports, SDB devices 404, and O2E converters 502, and E2O converters 504, according to at least one embodiment. The memory module 500 is similar to memory module 400, as noted by similar reference numbers. As illustrated in FIG. 5, the memory module 500 includes a downstream serial interface 501 and an upstream serial interface 503. The downstream serial interface 501 and the upstream serial interface 503 are optical-to-electrical interfaces that include optical links and electrical links. Multiple SDB devices 404 are coupled to the downstream serial interface 501 and the upstream serial interface 503 via O2E converters 502 and E2O converters 504. An O2E converter converts an optical signal to an electrical signal, and an E2O converter converts an electrical signal to an optical signal. In at least one embodiment, a first O2E converter is coupled to the first SDB device 404(1) via the downstream serial interface 406(1), and a first E2O converter is coupled to the first SDB device 404(1) via the upstream serial interface 408(1).

Figure 6:
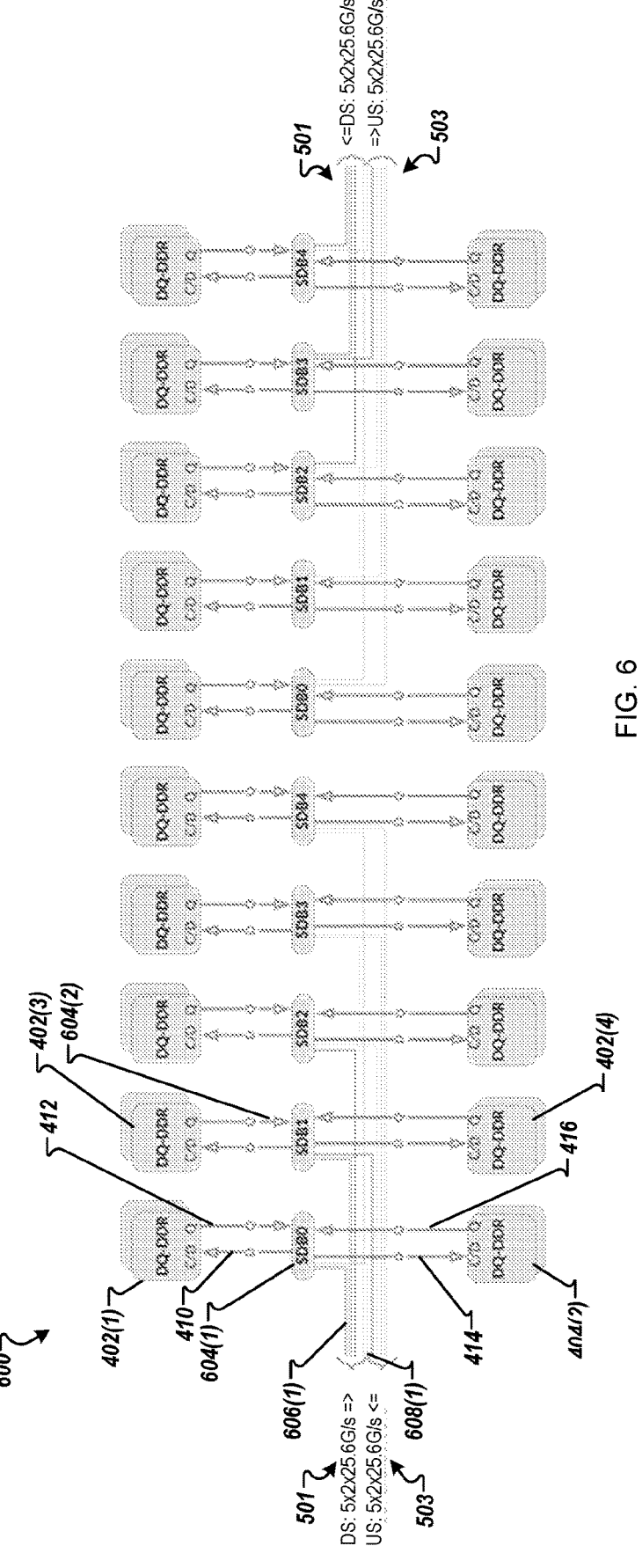
FIG. 6 is a block diagram illustrating a memory module with DRAM devices with unidirectional ports and optical SDB devices, according to at least one embodiment.

FIG. 6 is a block diagram illustrating a memory module 600 with DRAM devices 402 with unidirectional ports and optical SDB devices 604(1), according to at least one embodiment. The memory module 600 is similar to memory module 400, as noted by similar reference numbers. As illustrated in FIG. 6, the memory module 600 includes a downstream serial interface 601 and an upstream serial interface 603, which each include optical links coupled to multiple optical SDB devices 604.

Figure 7:
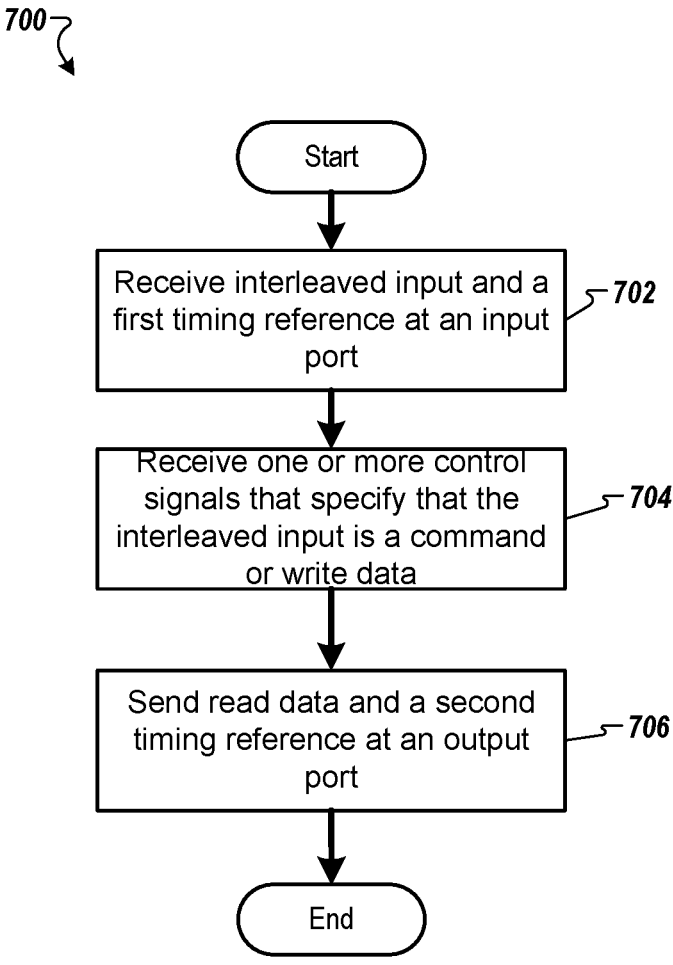
FIG. 7 is a flow diagram of a method for operating a memory device with unidirectional ports, according to an embodiment.

FIG. 7 is a flow diagram of a method 700 for operating a memory device with unidirectional ports, according to an embodiment. The method 700 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 700 is performed by the memory device 100 of FIG. 1. In another embodiment, the method 700 is performed by any of the DRAM devices 402 of FIGS. 5-7.

Referring to FIG. 7, at block 702, method 700 begins by the processing logic receiving, at an input port of the memory device, interleaved input and a first timing reference. The interleaved input includes one or more commands and write data. In one embodiment, the interleaved input is a write command. In another embodiment, the interleaved input is a read command. In another embodiment, the interleaved input is the write data. Alternatively, the interleaved input is a write command and a read command was previously received at the input port. At block 704, the processing logic receives, at a control port of the memory device, one or more control signals that specify that the interleaved input is the one or more commands or the write data. In one embodiment, the one or more control signals specify that the interleaved input is the write data associated with a write command received before block 702. In another embodiment, the one or more control signals specify that the interleaved input is the write command or the read command. At block 706, the processing logic transmits, at an output port of the memory device, read data and a second timing reference. In this embodiment, the read data is transmitted in response to a read command received prior to block 706, such as from a previous command sequence. In at least one embodiment, the write data is received concurrently with transmitting the read data. In another embodiment, the write or read command is received concurrently with transmitting the read data.

Figure 8:
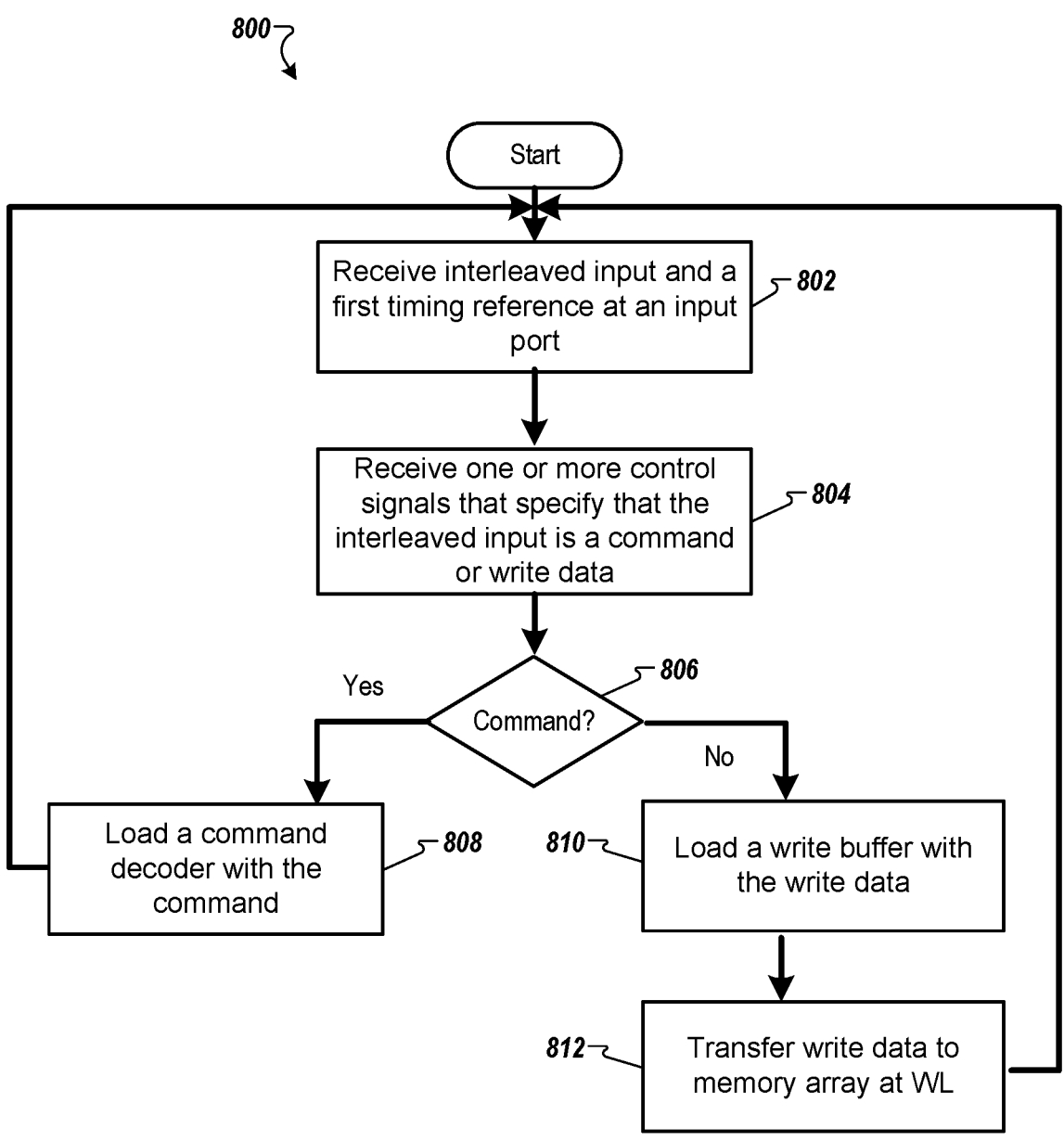
FIG. 8 is a flow diagram of a method for operating a memory device with an input port that receives commands and write data, according to an embodiment.

FIG. 8 is a flow diagram of a method 800 for operating a memory device with an input port that receives commands and write data, according to an embodiment. The method 800 may be performed by decoding logic that may comprise hardware (e.g., circuitry, dedicated logic, programmable logic, microcode, etc.), software (e.g., instructions run on a processing device to perform hardware simulation), or a combination thereof. In one embodiment, the method 800 is performed by the memory device 100 of FIG. 1. In another embodiment, the method 800 is performed by any of the DRAM devices 402 of FIGS. 5-7.

Referring to FIG. 8, at block 802, method 800 begins by the decoding logic receiving, at an input port of the memory device, interleaved input and a first timing reference. The interleaved input includes commands or write data. At block 804, the decoding logic receives, at a control port of the memory device, one or more control signals that specify that the interleaved input is the one or more commands or the write data. The processing logic determines whether the interleaved input is a command or write data at block 806. If the interleaved input is a command at block 806, the decoding logic loads a command decoder with the command (block 808), and returns to block 802 to receive additional interleaved input. If the interleaved input is write data at block 806, the decoding logic loads a write buffer with the write data (block 810). The decoding logic transfers the write data from the write buffer to the memory array at a write latency (WL) (block 812), and returns to block 802 to receive additional interleaved input.

For example, the decoding logic can receive a first input packet with a first command at block 802 in a first instance and a second input packet with first write data at block 802 in a second instance. The decoding logic receives one or more write clock strobes at block 802. At block 804, the decoding logic can receive a first command signal that specifies that the interleaved input is the first command in the first instance and a second command signal that specifies that the interleaved input is the first write data in the second instance. In at least one embodiment, the decoding logic at block 806 determines whether the first command signal or the second command signal is received to determine whether the interleaved input is the first command or the first write data. The first command can be a read command or a write command. Although not illustrated in FIG. 8, the decoding logic can transmit read data and a second timing reference on an output port concurrently as the commands and write data are received on the input port. In at least one embodiment, a read command is received between a write command and its corresponding write data. In another embodiment, the decoding logic transmits status data or error data on the output port.

In at least one embodiment, decoding logic receives and stores a WL value in a register. The WL value can specify the amount of time between a write command being received and the write data being transferred to the memory array. Although the operations of the methods herein are shown and described in a particular order, the order of the operations of each method may be altered so that certain operations may be performed in an inverse order or so that certain operation may be performed, at least in part, concurrently with other operations. In certain implementations, instructions or sub-operations of distinct operations may be in an intermittent and/or alternating manner.

Figure 9:
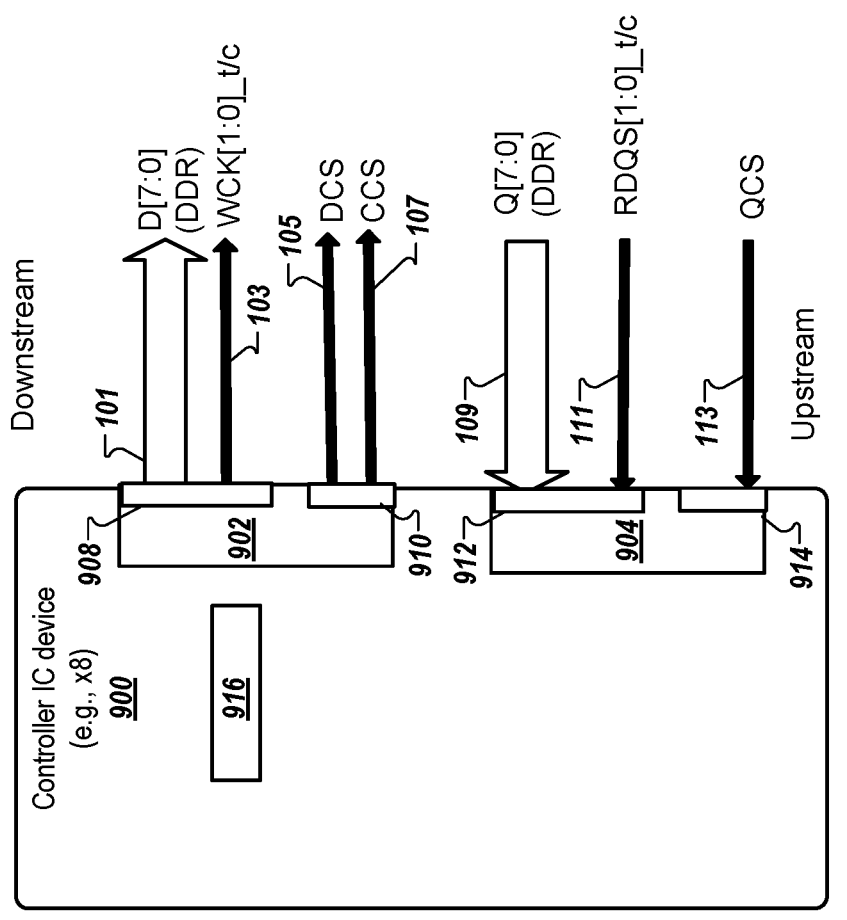
FIG. 9 is a block diagram of an integrated circuit controller device with unidirectional ports for concurrent interface operations, according to at least one embodiment.

FIG. 9 is a block diagram of an integrated circuit controller device 900 with unidirectional ports for concurrent interface operations, according to at least one embodiment. The integrated circuit controller device 900 (hereinafter "controller device 900") includes a downstream serial interface 902 and an upstream serial interface 904. The downstream serial interface 902 includes an output port 908 and a control port 910. The upstream serial interface 904 includes an input port 912 and a control port 914. In at least one embodiment, the output port 908, the control port 910, and the input port 912 are unidirectional ports.

In at least one embodiment, the output port 908 transmits interleaved input 101 and a first timing reference 103 to a memory device (e.g., 100). As described above, the first timing reference 103 can be differential clock strobes (e.g., WCK[1:0]_t/c). The first timing reference 103 can be a single-ended clock signal or strobe. The interleaved input 101 can include commands (e.g., read commands, write commands) and write data. The control port 910 transmits one or more control signals that specify that the interleaved input is the one or more commands or the write data to the memory device (e.g., 100). As illustrated in FIG. 9, the control port 910 sends a first command signal 105 (CCS) that specifies that the interleaved input 101 is a command or a second signal 107 (DCS) that specifies that the interleaved input 101 is write data. The first command signal 105 can be a chip select type signal, a strobe signal, an enable signal, a command enable signal, or the like. In at least one embodiment, the first command signal 105 and the second command signal 107 can be communicated as different levels of the same signal. Using two command signals allows four states to be used, including a command state, a data state, a status state (e.g., both the first command signal 105 and the second command signal 107 being asserted together), and a reserved state, for example.

In at least one embodiment, the input port 912 receives output data 109 and a second timing reference 111 from a memory device (e.g., 100). The output data 109 can be read data, status data, error data, write acknowledgments, or the like. The second timing reference 111 can be a clock signal, such as differential clock strobes (e.g., RDQS[1:0]_t/c). The second timing reference 111 can be a differential clock signal or a single-ended clock signal or strobe. In at least one embodiment, the output port 908 transmits write data, and input port 912 receives read data concurrently. In at least one embodiment, the output port 908 transmits command data, and the input port 912 receives read data concurrently. The control port 914 receives one or more control signals that specify that the input port 912 is enabled or ready with the read data. As illustrated in FIG. 9, the control port 914 receives an output enable signal 113 (QCS) that specifies that the input port 912 is enabled for the read data. The output enable signal 113 can be a chip select type signal, a strobe signal, an enable signal, a command enable signal, or the like.

In at least one embodiment, the output port 908 and the input port 912 allow for concurrent interface operations, such as write data and read data being transferred concurrently or at the same time. Using the separate output port 908 and the input port 912, there are no turnaround delays by the memory device because the read and write transfers can co-occur. This can reduce the overall latency of the memory device.

During the operation of the controller device 900, the interleaved input 101 can include a first input packet with a first command and a second input packet with first write data. The first timing reference 103 includes a write clock signal (WCK) for the writing data's timing. The write clock signal can be one or two input strobes (e.g., two input strobes when the clock signal is a differential clock signal). The controller device 900 sends the first command signal 105 when the interleaved input 101 is the first command and sends the second command signal 107 when the interleaved input is the first write data. The first command signal 105 and the second command signal 107 specify whether the outgoing packet is a command or write data. In at least one embodiment, the controller device 900 includes a command encoder 916. The command encoder 916 is enabled and outputs the first command and the first command signal 105 that specifies that the interleaved input 101 is a command (e.g., a write command, a read command, or the like). The command encoder 916 is disabled when the interleaved input 101 is write data. The write data and the second command signal 107 are transmitted on the output port 908.

During the operation of the controller device 900, the output data 109 can include a first output packet with first read data. The second timing reference 111 can include a read clock signal. The read clock signal can be one or two read clock strobes (e.g., RDQS[1:0]_t/c when the read clock signal is a differential clock signal). The output data 109 can also include a second output packet with first status data, write acknowledgment, errors, or the like. The controller device 900 receives the output enable signal 113. The output enable signal 113 can specify that the first read data is enabled on the input port 912. Alternatively, the controller device 900 receives the output enable signal 113 to specify that status data, error data, or the like is ready or enabled on the input port 912.

In at least one embodiment, the interleaved input 101 includes a third input packet with a first read command. The third input packet can be sent between the first input packet and the second input packet by the controller device 900 and received by the memory device 100, as illustrated in FIGS. 2A-2B.

In at least one embodiment, the controller device 900 can program the register 120 of the memory device 100 to store a write latency (WL) value. The WL value specifies an amount of time between when a write command is received at the input port 108 of the memory device 100 and the corresponding write data is transferred to the memory array 106. In another embodiment, the memory device 100 can have a WL parameter that specifies the amount of time it takes the write data to be ready to transfer to the memory array 106, and the WL value can be an offset value that is added or subtracted from the WL parameter to specify when the write data is transferred from the write buffer 118 to the memory array 106. In this embodiment, the controller device 900 programs the WL value in the register 120 to be used as the offset to the WL parameter.

In at least one embodiment, the functionality of the controller device 900 can be integrated into the SDB devices described and illustrated with respect to FIGS. 4-6.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

In the above description, numerous details are set forth. It will be apparent, however, to one skilled in the art, that aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving," "determining," "selecting," "storing," "setting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general-purpose computer selectively activated or reconfigured by a computer program stored in the computer. Such a computer program may be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any procedure for storing or transmitting information in a form readable by a machine (e.g., a computer). For example, a machine-readable (e.g., computer-readable) medium includes a machine (e.g., a computer) readable storage medium (e.g., read-only memory ("ROM"), random access memory ("RAM"), magnetic disk storage media, optical storage media, flash memory devices, etc.).

What is claimed is:

1. An integrated circuit memory device comprising:
   an input port to receive interleaved input and a first timing reference, wherein the interleaved input comprises one or more commands and write data;
   a single control port to receive one or more control signals that specify that the interleaved input is the one or more commands or the write data; and
   an output port to transmit read data and a second timing reference.

2. The integrated circuit memory device of claim 1, wherein the input port, the single control port, and the output port are unidirectional ports.

3. The integrated circuit memory device of claim 1, wherein the input port is to receive the write data, and the output port is to transmit the read data concurrently with the input port receiving the write data.

4. The integrated circuit memory device of claim 1, wherein the interleaved input comprises a first input packet with a first command, wherein the interleaved input comprises a second input packet with first write data, wherein the first timing reference comprises one or more write clock strobes, and wherein the one or more control signals comprise a first command signal that specifies that the interleaved input is the first command and a second command signal that specifies that the interleaved input is the first write data, wherein the integrated circuit memory device further comprises:
   a command decoder, wherein the command decoder is loaded with the first command responsive to the first command signal; and
   a write buffer, wherein the write buffer is loaded with the first write data responsive to the second command signal.

5. The integrated circuit memory device of claim 1, wherein the read data comprises a first output packet with first read data, and wherein the first output packet comprises error correction code (ECC) data, wherein the output port is to transmit an output enable signal or status data.

6. The integrated circuit memory device of claim 1, further comprising:

a memory array;

a write buffer, wherein the interleaved input comprises a first input packet with a first write command and a second input packet with first write data; and a register to store a write latency (WL) value that specifies an amount of time between when the first write command is received at the input port and the first write data is transferred to the memory array, wherein the interleaved input comprises a third input packet with a first read command, wherein the third input packet is received between the first input packet and the second input packet.

7. A memory module comprising:

a first serial data buffer (SDB) device configured to couple to a downstream serial interface and an upstream serial interface; and a first memory device coupled to the first SDB device, wherein the first memory device comprises:

an input port to receive first interleaved input and a first timing reference, wherein the first interleaved input comprises a command or write data;

a single control port to receive one or more control signals that specify that the first interleaved input is the command or the write data; and an output port to transmit read data and a second timing reference.

8. The memory module of claim 7, further comprising:

a second memory device coupled to the first SDB device, wherein the second memory device comprises:

an input port to receive second interleaved input and a third timing reference, wherein the second interleaved input comprises a command or write data;

a control port to receive one or more control signals that specify that the second interleaved input is the command or the write data; and an output port to transmit read data and a fourth timing reference.

9. The memory module of claim 7, further comprising:

a second SDB device configured to couple to the downstream serial interface and the upstream serial interface; and a second memory device coupled to the second SDB device, wherein the second memory device comprises:

an input port to receive second interleaved input and a third timing reference, wherein the second interleaved input comprises a command or write data;

a control port to receive one or more control signals that specify that the second interleaved input is the command or the write data; and an output port to transmit read data and a fourth timing reference.

10. The memory module of claim 7, wherein the downstream serial interface comprises a set of differential pairs of receiver lines, and the upstream serial interface comprises a set of differential pairs of transmitter lines.

11. The memory module of claim 7, further comprising:

an optical-to-electrical (O2E) converter coupled to the first SDB device; and an E2O converter coupled to the first SDB device.

12. The memory module of claim 7, wherein the first SDB device is an optical SDB device, and wherein the downstream serial interface and the upstream serial interface are optical interfaces.

13. A method of operating a memory device, the method comprising:

receiving, at an input port of the memory device, interleaved input and a first timing reference, wherein the interleaved input comprises one or more commands and write data;

receiving, at a single control port of the memory device, one or more control signals that specify that the interleaved input is the one or more commands or the write data; and transmitting, at an output port of the memory device, read data and a second timing reference.

14. The method of claim 13, wherein receiving the write data and transmitting the read data are performed concurrently.

15. The method of claim 13, wherein receiving the interleaved input and the first timing reference comprises:

receiving a first input packet with a first command;

receiving a second input packet with first write data;

receiving one or more write clock strobes, and wherein receiving the one or more control signals comprises:

receiving a first command signal that specifies that the interleaved input is the first command; and receiving a second command signal that specifies that the interleaved input is the first write data.

16. The method of claim 15, further comprising:

loading a command decoder of the memory device with the first command responsive to the first command signal; and loading a write buffer of the memory device with the first write data responsive to the second command signal.

17. The method of claim 15, further comprising:

storing the first write data into a write buffer of the memory device; and transferring the write data to a memory array of the memory device after the first write data is stored in the write buffer.

18. The method of claim 15, further comprising:

storing a write latency (WL) value in a register of the memory device;

storing the first write data into a write buffer of the memory device; and transferring the write data to a memory array of the memory device according to the WL value, wherein the WL value specifies an amount of time between a write command being at the input port and the write data is transferred to the memory array.

19. The method of claim 15, wherein receiving the interleaved input and the first timing reference comprises:

receiving a third input packet with a first read command between receiving the first input packet and receiving the second input packet.

20. The method of claim 13, further comprising:

transmitting, at the output port of the memory device, status data and the second timing reference.

* * * * *